(12) United States Patent
Lee

(10) Patent No.: US 7,193,902 B2
(45) Date of Patent: Mar. 20, 2007

(54) METHOD OF ERASING A FLASH MEMORY CELL

(75) Inventor: Hee Y. Lee, Kyungki-Do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 11/412,737

(22) Filed: Apr. 27, 2006

(65) Prior Publication Data

US 2006/0198203 A1 Sep. 7, 2006

Related U.S. Application Data

(62) Division of application No. 11/118,858, filed on Apr. 29, 2005, now Pat. No. 7,072,226, which is a division of application No. 10/364,137, filed on Feb. 11, 2003, now Pat. No. 6,934,193, which is a division of application No. 09/896,663, filed on Jun. 29, 2001, now Pat. No. 6,545,914.

(30) Foreign Application Priority Data

Jun. 29, 2000 (KR) ................ 2000-36519

(51) Int. Cl.
*G11C 16/04* (2006.01)
(52) U.S. Cl. ............... 365/185.33; 365/185.18; 365/185.29
(58) Field of Classification Search ....... 365/185.18 X, 365/185.19, 185.29 X, 185.33 O, 185.18, 365/185.29, 185.33
See application file for complete search history.

(56) References Cited

U.S. PATENT DOCUMENTS

| 4,233,526 | A | 11/1980 | Kurogi et al. |
|---|---|---|---|
| 5,357,463 | A | 10/1994 | Kinney |
| 5,521,866 | A | 5/1996 | Akaogi |
| 5,615,152 | A | 3/1997 | Bergemont |
| 5,617,357 | A | 4/1997 | Haddad et al. |
| 5,862,078 | A | 1/1999 | Yeh et al. |
| 5,949,717 | A | 9/1999 | Ho et al. |
| 5,978,276 | A | 11/1999 | Wong |
| 5,998,826 | A | 12/1999 | Hung et al. |
| 5,999,443 | A | 12/1999 | Ling et al. |
| 6,009,017 | A * | 12/1999 | Guo et al. ............. 365/185.28 |
| 6,049,486 | A | 4/2000 | Lee et al. |
| 6,122,201 | A | 9/2000 | Lee et al. |
| 6,285,588 | B1 | 9/2001 | Fastow |

OTHER PUBLICATIONS

Korean Intellectual Property Office Official Action dated May 27, 2003 (2 pages).

* cited by examiner

*Primary Examiner*—VanThu Nguyen
(74) *Attorney, Agent, or Firm*—Marshall, Gerstein & Borun LLP

(57) ABSTRACT

Methods are disclosed for erasing a flash memory cell including: (a) a semiconductor substrate, (b) a gate, (c) a source, (d) a drain, (e) a well, the gate including: (1) a tunnel oxide film, (2) a floating gate, (3) a dielectric film and (4) a control gate stacked on the semiconductor substrate. In one of the disclosed methods, a negative bias voltage is applied to the control gate, the source and drain are floated, a positive bias voltage is applied to the well to thereby create a positive bias voltage in the source and the drain, a ground voltage is applied to the well at a first time while maintaining the negative bias voltage a the control gate; and subsequently a ground voltage is applied to the control gate.

8 Claims, 6 Drawing Sheets

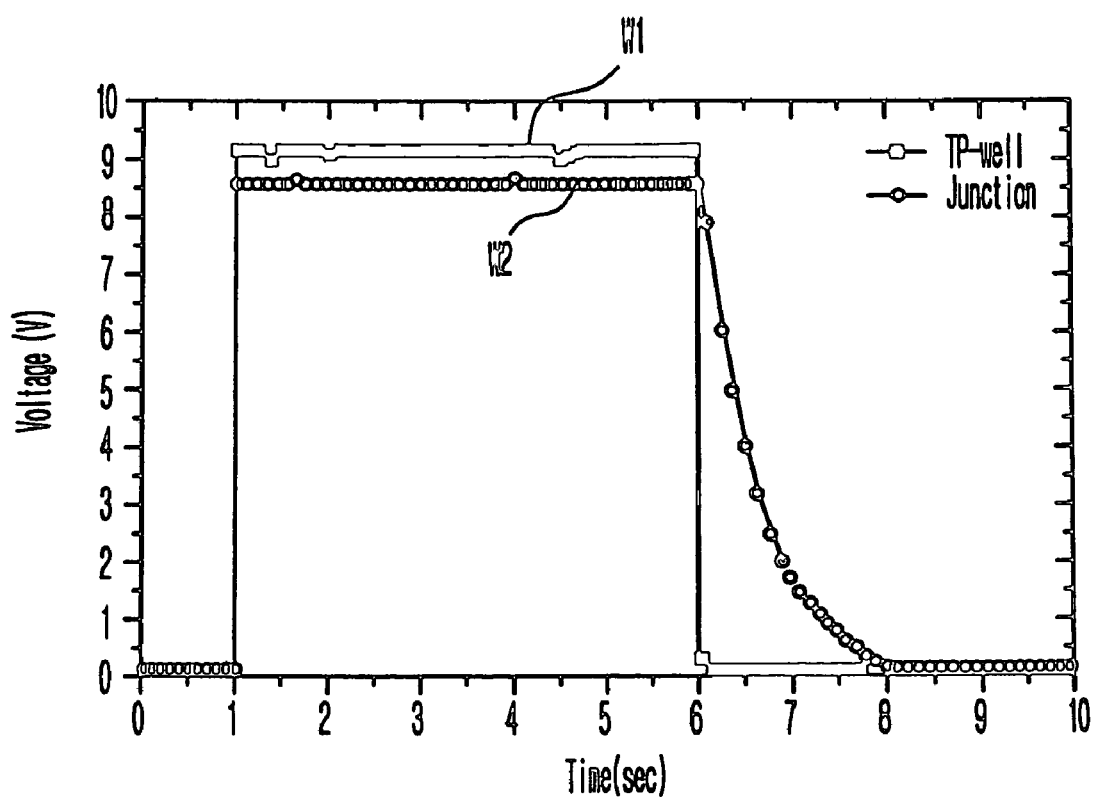

METHOD OF ERASING A FLASH MEMORY CELL

CROSS REFERENCE TO RELATED APPLICATIONS

This application is a divisional of U.S. Ser. No. 11/118,858 filed Apr. 29, 2005 now U.S. Pat. No. 7,072,226, which is a divisional of U.S. patent application Ser. No. 10/364,137 filed Feb. 11, 2003 (now U.S. Pat. No. 6,934,193), which is a divisional of U.S. patent application Ser. No. 09/896,663 filed Jun. 29, 2001 (now U.S. Pat. No. 6,545,914), which claims priority from Korean Patent Application Serial No. 2000-36519 filed Jun. 29, 2000, which are all incorporated herein by reference.

FIELD OF THE INVENTION

The present invention relates generally to a method of erasing a flash memory cell, and more particularly, to a method of erasing a flash memory cell having a stacked gate structure at an increased rate while minimizing the loss of stored data.

BACKGROUND OF THE INVENTION

Referring to FIG. 1, a flash memory cell generally includes a gate in which a tunnel oxide film 2, a floating gate 3, a dielectric film 4 and a control gate 5 are stacked on a channel of a semiconductor substrate 1. A source 6 and a drain 7 are formed in the semiconductor substrate 1 on either side of the gate.

The flash memory cell is typically programmed or erased by applying a bias voltage condition to the semiconductor substrate 1, the control gate 5, the source 6 and the drain 7. To program the flash memory cell, hot electrons are injected into the floating gate 3. On the other hand, to erase the flash memory cell, electrons injected into the floating gate 3 are discharged via the semiconductor substrate 1.

Erasing a flash EEPROM device typically involves changing all of the flash memory cells constituting a chip to the same state. In other words, the threshold voltages of all of the flash memory cells are changed to the same state.

The threshold voltage of a flash memory cell generally depends on the amount of charges injected into the floating gate 3. Therefore, in order to change the threshold voltages of all of the flash memory cells into the same state, electrons injected into the floating gate 3 are simultaneously discharged, a process which is usually performed using the prior art Fowler-Nordheim (F-N) tunneling method. As explained below, the use of the prior art F-N tunneling method overcomes a number of problems.

First, as electrons injected into a floating gate 3 typically have very low kinetic energy, they are unable to jump over a potential barrier of about 3.1 eV in the tunnel oxide film 2.

Second, although the electrons injected into the floating gate 3 of the flash memory cell are simultaneously discharged during the erasure operation, power consumption is minimized as the current flow is limited to the discharge of the electrons from the floating gate 3.

In the case of a flash EEPROM device having a sub-quarter design rule, that is, 0.25 μm, an erasure operation is performed using the prior art channel F-N tunneling method, as shown in FIG. 2.

FIG. 2 shows a flash memory cell having a triple well structure. Using a prior art method to erase the flash memory cell, a negative bias voltage (−V) is applied to a control gate 5, a positive bias voltage (+V) is applied to a P-well 1a and to a N-well 1b of a semiconductor substrate 1, while the source 6 and the drain 7 are floated. This results in the electrons (Θ), previously injected into the floating gate 3, being discharged via the semiconductor substrate 1. Using the prior art channel F-N tunneling effect causes the tunneling, region to become wider than when using a prior art junction erasure effect. As the dopant concentration of the channel becomes uniform, the number of flash memory cells that are erased early as a result of the induced electromagnetic field is reduced, so that the distribution of the threshold voltages after the implementation of the prior art erasure operation becomes constant. More specifically, as the dopant concentration of the channel and the well is increased, the number of holes that accumulate on the surface of the semiconductor substrate and the distribution of the electromagnetic field become uniform. As a result, the distribution degree becomes more constant. Also, as the speed is increased, the number of flash memory cells that are slowly erased is reduced. Therefore, the source 6 and the drain 7, that is, the junction region, is floated.

Referring to FIG. 3, using the prior art F-N tunneling effect, typically requires that a high electromagnetic field of more than 10 MV/cm be formed at both sides of the tunnel oxide film 2. Therefore, a high negative potential must be applied to the floating gate 3. In addition, the thickness of the dielectric film 4 must be reduced in order to increase the coupling capacitance (Cfg) between the control gate 5 and the floating gate 3, to which a negative bias voltage (−V) is applied.

The electromagnetic field (E) may be determined using Equation 1, where V is the applied voltage and t is the thickness of a dielectric film. Therefore, the thickness of the tunneling oxide film 2, acting as a dielectric film between the floating gate 3 and the channel, must be reduced.

$$E = V/t \qquad \text{Equation 1}$$

However, if the thickness of the dielectric film existing on and below the floating gate 3 is reduced, a number of problems may occur.

The flash EEPROM device is a nonvolatile memory device which stores data by injecting hot electrons into the floating gate 3. The stored data is often required to be stored for a period of ten or more years. An electromagnetic field is typically formed toward the direction of the floating gate 3 if hot electrons are over-charged into the floating gate 3. If the thickness of the dielectric film is too thin, electrons flow out of the floating gate as shown in FIG. 4. As a result, stored data may be transformed or lost.

Typically, if the thickness of the dielectric film is reduced, the speed of the erasure operation is increased but the conservation characteristic of the stored data is degraded. Therefore, there is a need for a new method of increasing the speed of the erasure operation while maintaining the thickness of the dielectric film.

SUMMARY OF THE INVENTION

In accordance with an aspect of the invention, a method is provided for erasing a flash memory cell including: (a) a semiconductor substrate, (b) a gate, (c) a source, (d) a drain and (e) a well, where the gate includes: (1) a tunnel oxide film, (2) a floating gate, (3) a dielectric film and (4) a control gate stacked on the semiconductor substrate. The method includes the steps of floating the source and the drain, applying a negative bias voltage to the control gate, applying a positive bias voltage to the well to thereby create a positive bias voltage in the source and the drain, applying a ground voltage to the well at a first time while maintaining the negative bias voltage a the control gate and subsequently applying a ground voltage to the control gate.

In accordance with an alternative aspect of the invention, a method is provided for erasing a flash memory cell including: (a) a semiconductor substrate, (b) a gate, (c) a source, (d) a drain and (e) a well, where the gate includes: (1) a tunnel oxide film, (2) a floating gate, (3) a dielectric film and (4) a control gate stacked on the semiconductor substrate. The method includes the steps of applying a negative bias voltage to the control gate, applying a positive bias voltage to the well, creating a positive bias voltage in the source and the drain, applying a ground voltage to the control gate and simultaneously floating the well, the source and the drain.

In accordance with another aspect of the invention, a method is provided for erasing a flash memory cell including: (a) a semiconductor substrate, (b) a gate, (c) a source, (d), a drain, (e) a P-well formed in the semiconductor substrate and (f) a N-well formed in the semiconductor substrate, where the gate includes: (1) a tunnel oxide film, (2) a floating gate, (3) a dielectric film and (4) a control gate stacked on the semiconductor substrate. The method includes the steps of floating the N-well, the source and the drain, applying a negative bias voltage to the control gate, applying a positive bias voltage to the P-well, applying a ground voltage to the P-well, applying a ground voltage to the control gate, creating a ground voltage at the source and the drain and applying a ground voltage to the N-well.

In accordance with yet another aspect of the invention, a method is provided for erasing a flash memory cell including: (a) a semiconductor substrate, (b) a gate, (c) a source, (d) a drain, (e) a well, where the gate includes: (1) a tunnel oxide film, (2) a floating gate, (3) a dielectric film and (4) a control gate stacked on the semiconductor substrate. The method includes the steps of floating the source and the drain, applying a positive bias voltage to the control gate, applying a negative bias voltage to the well to thereby create a negative bias voltage in the source and the drain, applying a ground voltage to the well at a first time while maintaining the positive bias voltage at the control gate and subsequently applying a ground voltage to the control gate.

BRIEF DESCRIPTION OF THE DRAWINGS

FIG. 6 is a graphical representation of the change in the potential in the junction region and in the P-well based on the application of the bias voltages illustrated in FIG. 5.

DETAILED DESCRIPTION OF THE PREFERRED EMBODIMENTS

Figure 1:
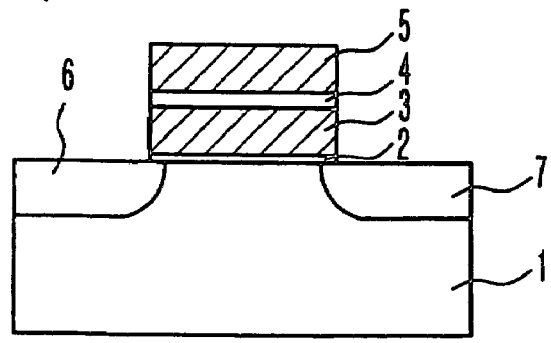
FIG. 1 is a cross-sectional view of a prior art flash memory cell.

A preferred method of erasing a flash memory cell in accordance with the teachings of the invention will be described in detail with reference to the accompanying drawings, in which like reference numerals are used to identify same or similar parts.

Figure 7A:
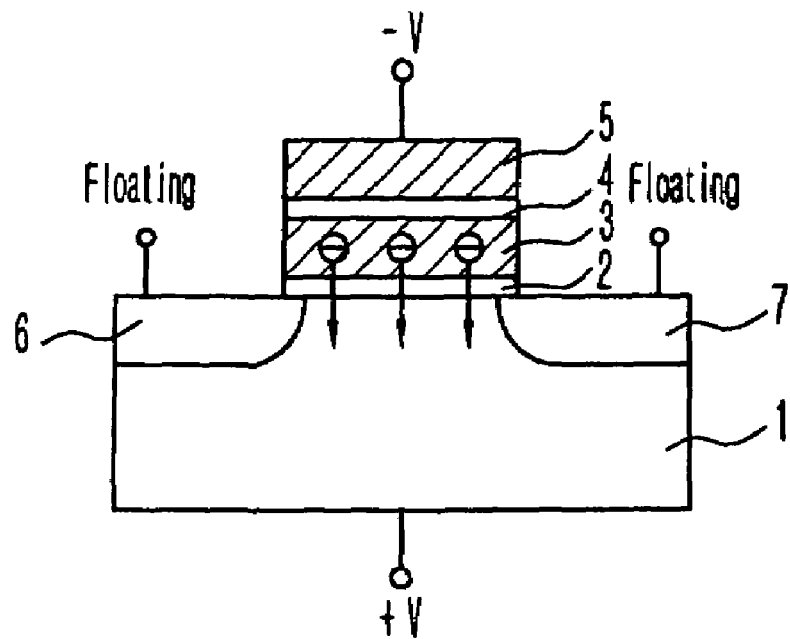
FIG. 7A and FIG. 7B are cross-sectional views of a flash memory cell illustrating a pathway of carriers in response to the application of the bias voltages illustrated in FIG. 5.
Figure 7B:
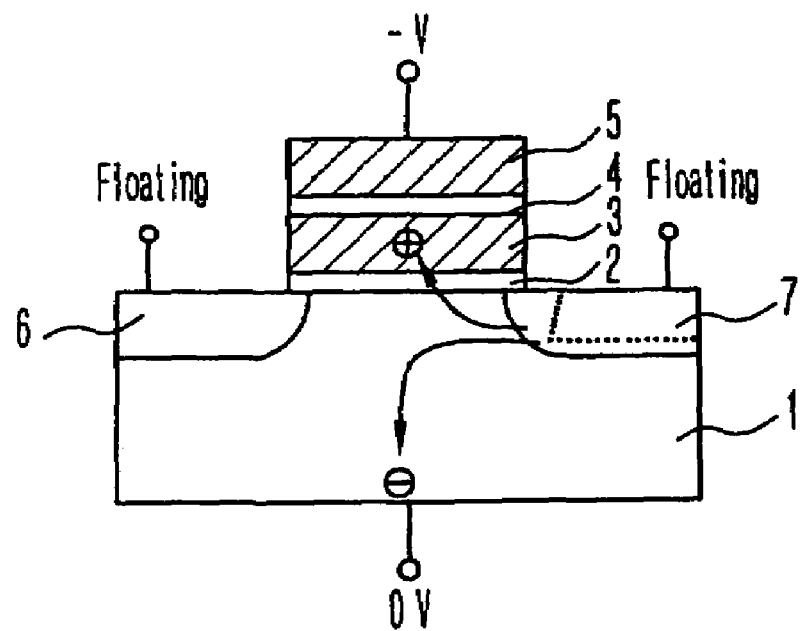

Referring to FIGS. 7A and 7B, an NMOS flash memory cell generally includes a semiconductor substrate 1, a stacked gate, a source 6, a drain 7, a junction region that is formed between the source 6 and the drain 7 and a P-well 1. The stacked gate includes a tunnel oxide film 2, a floating gate 3, a dielectric film 4 and a control gate 5 stacked on the semiconductor substrate 1. The well region doped with P-type dopants and the junction region doped with N-type dopants. The junction region typically has a dopant concentration that is greater than $1E20/cm^3$ and the well region typically has a dopant concentration falling within a range of approximately $1E16/cm^3$ to approximately $1E18/cm^3$. The tunnel oxide film 2 typically has a thickness that falls within a range of approximately 60Å to approximately 150Å. Referring to graph in FIG. 5, the flash memory cell erasure operation begins with floating the source 6 and the drain 7 at 0 volts and applying a negative bias voltage (−V) to the control gate 5. Shortly thereafter, a positive bias voltage (+V) ranging from approximately five volts to approximately 12 volts is applied to the P-well 1. P-N junctions are formed between the between the P-well 1 and the source 6 and between the P-well 1 and the drain 7. The free electrons and the free holes are drawn to interfaces between the source 6 and the P-well 1 and between the drain 7 and the P-well 1 such that a depletion region is formed where only charges having no movement remain. The width of the depletion region formed at each of the P-N junctions can be determined using Equations 2 and 3 provided below. Specifically, Equation 2 is used to determine $X_p$, the width of the depletion region at the P-well, and Equation 3 is used to determine $X_n$, the width of the depletion region at the junction region, where $\epsilon$ is the dielectric constant, q is the charge of a single electron, $N_d$ is the donor concentration, $N_a$ is the acceptor concentration and $V_i$ is the built-in potential.

$$X_p = \sqrt{[(2\epsilon/q)*(N_d/N_a)*\{1/(N_a+N_d)\}*V_i]} \quad \text{Equation 2}$$

$$X_n = \sqrt{[(2\epsilon/q)*(N_a/N_d)*\{1/(N_a+N_d)\}*V_i]} \quad \text{Equation 3}$$

The width of the total depletion region (W) can be determined using Equation 4.

$$W = X_p + X_n = \sqrt{[(2\epsilon/q)*(1/N_d + 1/N_a)*V_i]} \approx \sqrt{[(2\epsilon/q)*(1/N_a)*V_i]} \quad \text{Equation 4:}$$

Since each side of the depletion layer is at an opposite charge with respect to each other, each side can be viewed as the plate of a capacitor and the depletion region forms a junction capacitor acting as a dielectric in the form of a general parallel plate capacitor. The junction capacitance ($C_j$) can be determined using Equation 5.

$$C_j = \epsilon A/W = (A/2)*\sqrt{[(2q\, \epsilon^* N_a^* V_i)]} \quad \text{Equation 5}$$

The implementation of the erasure operation employs the junction capacitance. As mentioned previously, prior to the application of the bias voltages to the control gate 5 and the P-well 1, a bias voltage of 0 volts is applied to the source 6 and to the drain 7. The source 6 and the drain 7 are then floated such that the potential of the source 6 and the drain 7 are both maintained at a ground potential (0 volts). When the positive voltage (+V) is then applied to the P-well 1, and forward P-N junction diodes are formed between the source 6 and the P-well 1 and between the drain 7 and the P-well 1. The holes, which constitute the majority of the carriers in the P-well 1, are drawn towards the source 6 and the drain 7 and the potential at the source 6 and at the drain 7 increase in a positive direction.

The potential at the source 6 and at the drain 7 increase taking into account the built-in potential difference of the P-N junction in an equilibrium state.

Since in a forward P-N junction diode, the built-in potential is typically about 0.7 volts, the source 6 and the drain 7 maintain a bias voltage of about 0.7 volts less than the bias voltage that is applied to the P-well 1. For example, if the bias voltage applied to the P-well 1 is approximately 9 volts, the source 6 and the drain 7, being a floating state, maintains a potential of about 8.3 volts. As result, the majority of the electrons previously injected into the floating gate 3 are discharged.

Next, a voltage of 0 volts is applied to the P-well 1 such that the potential at the P-well 1 is reduced to 0 volts within a very short period of time. Unlike the P-well 1, the potential at the source 6 and the drain 7 is not discharged instantly by the charge storage junction capacitor but is discharged gradually, as shown in FIG. 6. In FIG. 6, the lines W1 and W2 illustrate changes in potential in the P-well 1 and in the junction region of a flash memory cell having a well with a triple structure where the junction region is floated and a bias voltage of 0 volts is applied to the P-well 1. Specifically, line W1 indicates the potential change in the P-well 1 and the line W2 indicates the potential change in the junction region.

Electromagnetic fields are created based on the potential differences between the source 6 and the P-well 1 and between the drain 7 and the P-well 1 forcing the holes to leave the source 6 and the drain 7 until the potential at the source 6 and the drain 7 are pulled down to 0 volts.

If a voltage of 0 volts is applied to the source 6 and the drain 7 before the potential at the P-well 1 reaches 0 volts, a forward bias condition is created whereby, a large current flow is created instantly. Such a condition can critically damages the source 6 and the drain 7. Therefore, a potential of 0 volts is applied to the P-well 1, which in turn causes the source 6 and the drain 7 to be gradually pulled down to 0 volts, so that a large electromagnetic field can be formed between the junction region and the well thereby preventing the damagingly large current flow.

As the size of the flash memory cell is reduced, a punch-through phenomenon is generated. The dopant concentration of the well must be increased in order to prevent the punch through phenomenon. In other words, as Na, the acceptor concentration, is increased, the width of the depletion region is reduced, which further increases the junction capacitance and thus increases the electromagnetic field.

Figure 5:
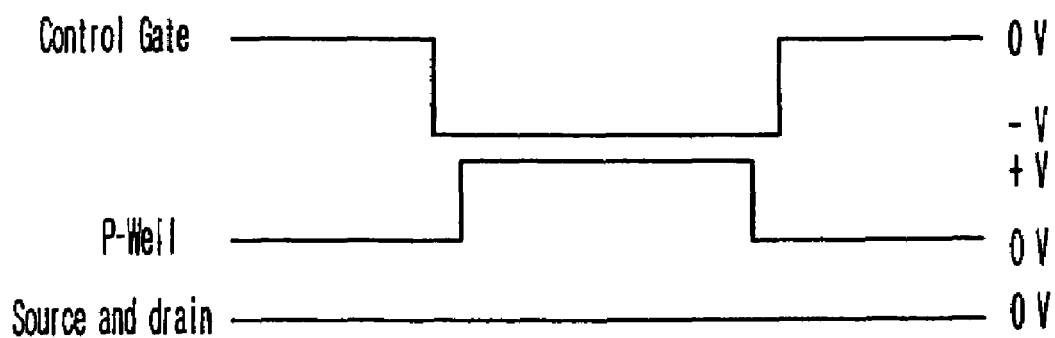
FIG. 5 is a graphical representation of the bias voltage applied to the control gate, to the P-well, to the source and to the drain in an exemplary erasure method performed in accordance with the teachings of the invention.

The control gate 5 to which a negative bias (−V) is applied is removed some time period after the P-well 1 has been discharged, as shown in FIG. 5, so that, prior to grounding the control gate 5, electromagnetic fields are vertically formed between the source 6 and the control gate 5 and between the drain 7, and the control gate 5. As the electromagnetic fields, thus formed, form corner electromagnetic fields along with the side electromagnetic fields formed between the source 6 and the P-well 1a and between the drain 7 and the P-well 1, numerous hot holes and hot electrons are generated as a result of a junction avalanche breakdown or band-to-band tunneling. As the hot holes thus generated flow over the barrier potential (4.3 eV) of the tunnel oxide film, the direction of the hot holes are changed by the vertically formed electromagnetic field and are, thus, injected into the floating gate 3, which removes electrons by offset of the potential due to the recombination of the hot holes with the injected electrons. The recombination process facilitates the performance of the erasure operation. That is, as shown in FIG. 7A and FIG. 7B, the recombination of the holes and the electrons, which are injected in a state in which the electrons are discharged from the floating gate by the F-N tunneling effect promotes the erasure operation to thereby reduce erasure time.

Figure 8:
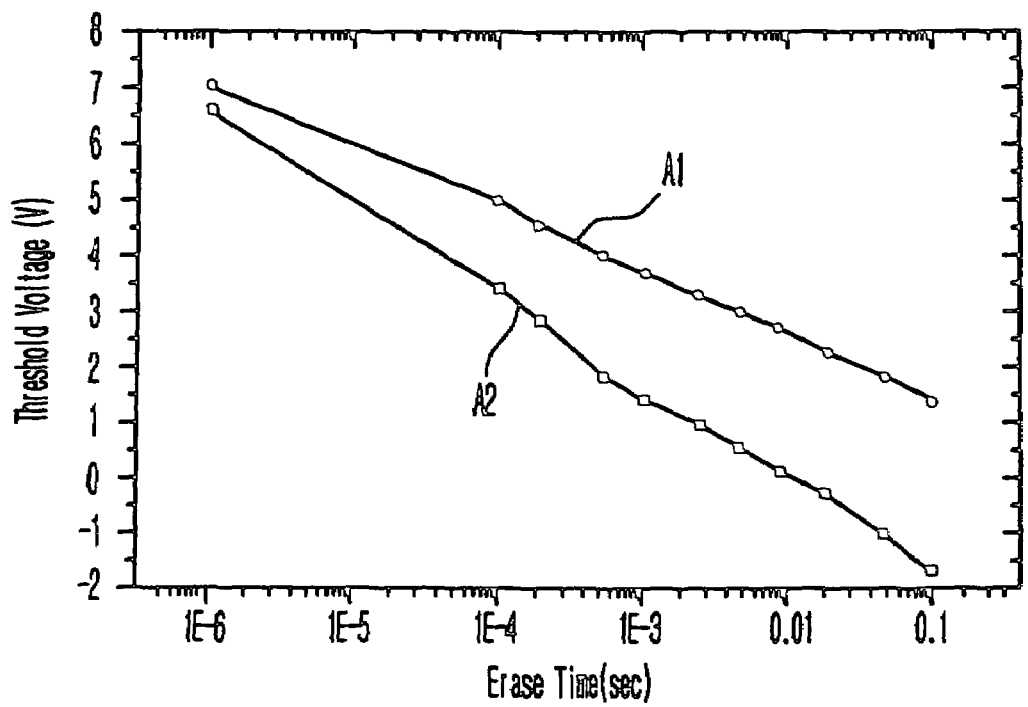
FIG. 8 is a graphical representation comparing the erasure time results from using a prior art method of erasing a flash memory cell and the erasure time results from using an exemplary erasure method performed in accordance with the teachings of the invention.

Referring to FIG. 8, a line A1 indicates a change in the threshold voltage of a flash memory cell as a function of the erasure time when a prior art erasure method is used, and a line A2 indicates a change in the threshold voltage of a flash memory cell as a function of the erasure time when an exemplary erasure method in accordance with the teachings of the invention is used.

Figure 9:
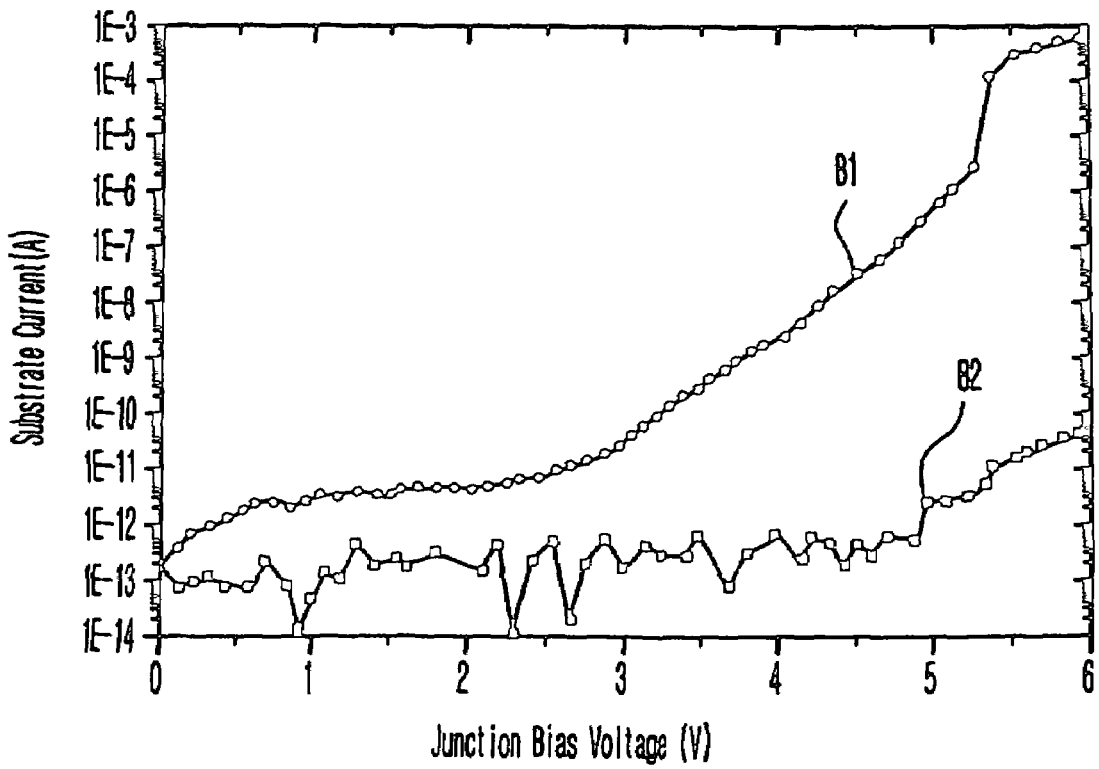
FIG. 9 is a graphical representation of the substrate current and the control gate current as a function of the junction bias voltage during an exemplary erasure method performed in accordance with the teachings of the invention.

FIG. 9 shows that hot holes are injected when a bias voltage of more than 5 volts is created at the source 6 and the drain 7. More specifically, lines B1 and B2 show currents passing through the control gate 5 by hot holes, which are generated depending on the potential difference between the junction region in which a bias voltage is present and the P-well 1 having the potential of 0 volts. The line B 1 indicates the flow through the substrate and the line B2 indicates the flow through the control gate 5.

Figure 10:
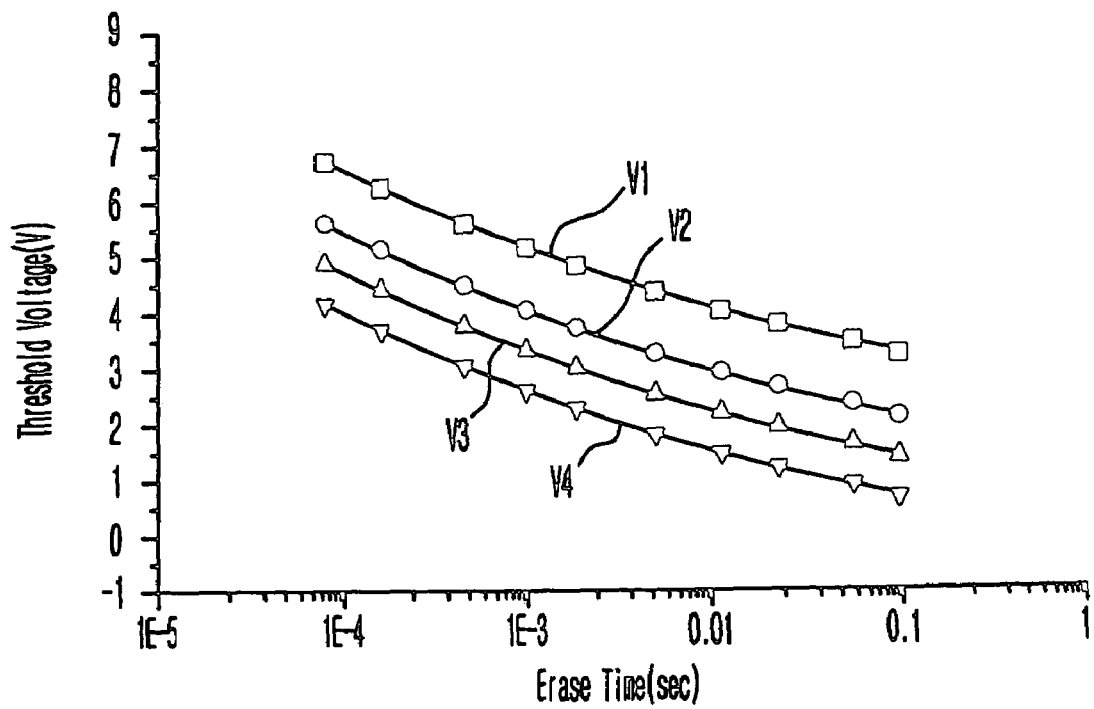
FIG. 10 is a graphical representation of changes in threshold voltage as a function of erase time for variations in the the bias voltage applied to the well.

Referring to FIG. 10, as the bias voltage applied to the well is increased, the potential of the source 6 and the drain 7 is increased thereby increasing the generation ratio of the hot holes and increasing the speed of the erasure operation. Lines V1, V2, V3 and V4 indicate changes in the threshold voltage of the flash memory cell as a function of the erasure time as the bias voltages applied to the well are 6 volts, 6.5 volts, 7 volts and 8 volts, respectively. As can be seen, a greater number of holes are generated as the higher bias voltages are applied to the P-well 1.

The source 6 and the drain 7 are floated to generate a pure junction capacitance. Thus, as an external current flow is not required, the consumption of current is minimized. Also, as the hot hole injection method is employed and it gives a direction to the vertically formed electromagnetic field, the capacitance value need not be as high. Therefore, as a reduction in the thickness of the tunnel oxide film 2 and the dielectric film 4 is avoided, a degradation in the data conservation capability is minimized. That is, the disclosed method minimizes the consumption of current while preserving the thickness of the tunnel oxide film 2 and the dielectric film 4. As a result, the speed of the erasure operation is increased.

An alternate method of erasing a flash memory cell in accordance with the teachings of the invention can be implemented in a flash memory device including PMOS flash memory cells. A PMOS flash memory cell (not shown) generally includes a semiconductor substrate, a stacked gate, a source, a drain, a junction region formed in the semiconductor substrate between the source and the drain and an N-well. The stacked gate includes a tunnel oxide film, a floating gate, a dielectric and a control gate stacked on the semiconductor substrate. The N-well region is doped with N-type dopants while the junction region is doped with P-type dopants. The junction region typically has a dopant concentration that is greater than $1E20/cm^3$ and the N-well region typically has a dopant concentration falling within a range of approximately $1E16/cm^3$ to approximately $1E18/cm^3$.

The PMS flash memory cell erasure operation begins with the application of a positive bias voltage (+V) to the control gate and a negative bias voltage (−V) to the N-well while the junction region, that is the source and the drain, are floated. The negative bias voltage applied to the N-well typically ranges from approximately five volts to approximately 12 volts. N-P junctions are formed between the N-well and the source and between the N-well and the drain. The free electrons and the free holes are drawn to interfaces between the source and the N-well and between the drain and the N-well such that a depletion region is formed. As in the case with the PMOS flash memory cell, a ground voltage is applied to the N-well while maintaining the positive bias voltage at the control gate. Some time period after the N-well has discharged, a ground voltage is applied to the control gate.

Figure 2:
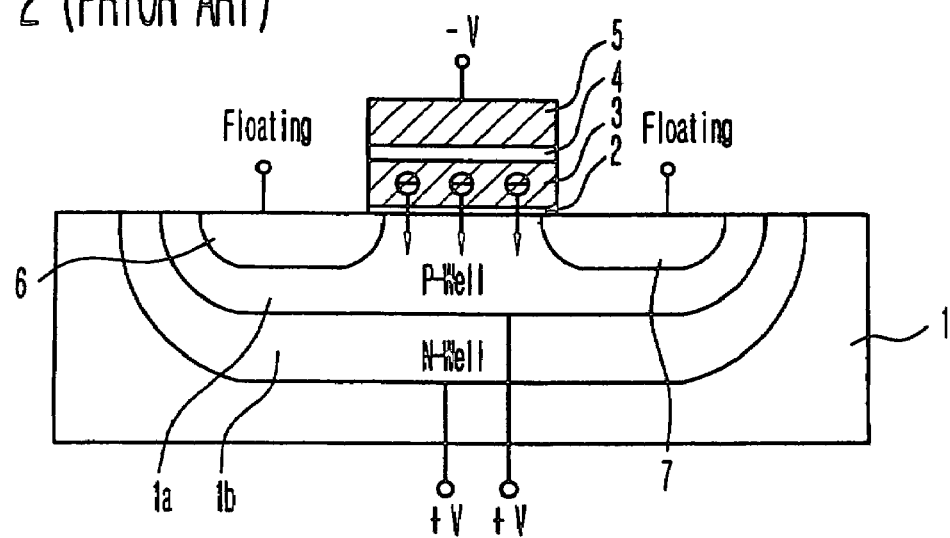
FIG. 2 is a cross-sectional view of a prior art flash memory cell having a triple well structure.
Figure 3:
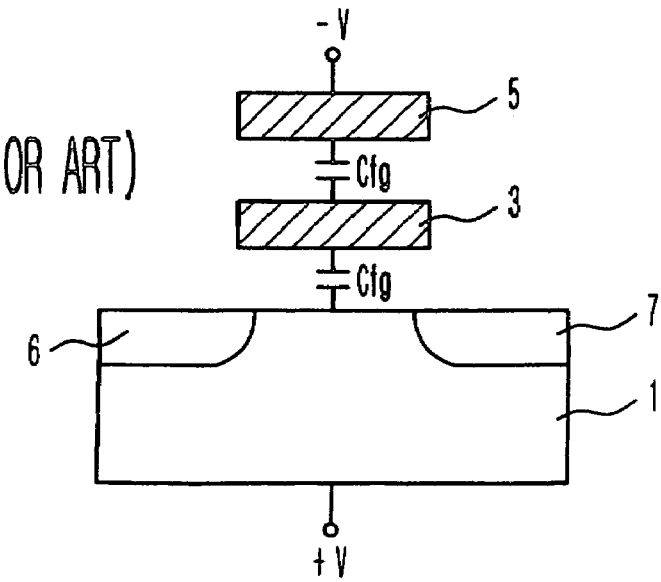
FIG. 3 is a segmented cross-sectional view of a prior art flash memory cell illustrating the presence of coupling capacitance within the flash memory cell.
Figure 4:
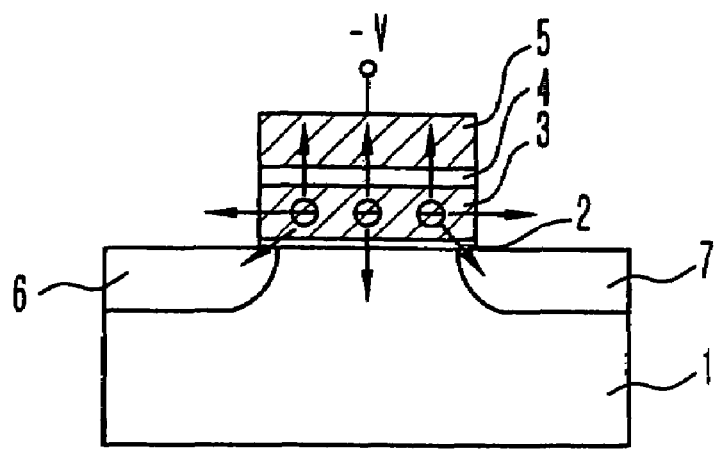
FIG. 4 is a cross-section view of a prior art flash memory cell illustrating the discharge path of the previously injected electrons from the floating gate when the thickness of the dielectric film is too thin.

The above described method of erasing a flash memory cell can be applied to a memory device having flash memory cells having a triple well structure. Referring to FIG. 2, a flash memory cell having a triple well structure generally includes both a P-well 1a and a N-well 1b formed in a semiconductor substrate 1. The N-well 1b separates the P-well 1a from the P-type semiconductor substrate. The N-well typically has a dopant concentration within a range of approximately $1E18/cm^3$ to $1E19/cm^3$ and the P-well typically has a dopant concentration within a range of approximately $1E16/cm^3$ to $1E18/cm^3$. The triple structure flash memory cell also includes a stacked gate in which a tunnel oxide film 2, a floating gate 3, a dielectric film 4 and a control gate 5 are stacked on the semiconductor substrate. A source 6 and a drain 7 are formed in the semiconductor substrate on either side of the stacked gate. The tunnel oxide film 2 typically has a thickness that falls within a range of approximately 100 Å to approximately 200 Å.

Figure 11:
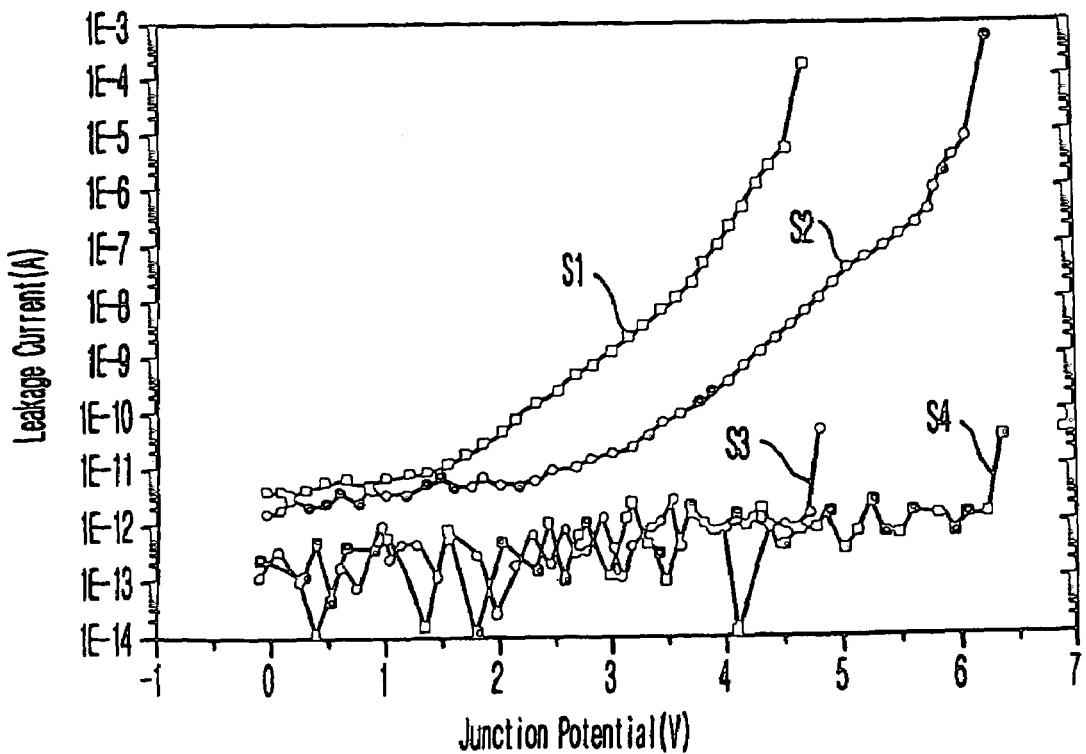
FIG. 11 is a graphical representation of the leakage current as a function of junction potential with a well of a triple well structure flash memory cell floated and with a junction region floated.

In this approach, the erasure operation begins with the application of a negative bias voltage to the control gate 5 and a positive bias voltage (+V) to the P-well 1a while the N-well and the junction region are floated. A forward P-N junction diode is formed between the P-well 1a and the N-well 1b, thereby changing the N-well 1b into a positive potential. When a voltage of 0 volts is then applied to the P-well 1a, the voltage at the source 6 and the drain 7 gradually discharges to 0 volts. An electromagnetic field is formed between the N-well 1b and the P-well 1a as well as between the P-well 1a and the source 6 and between the P-well and the drain 7 such that hot holes are generated. The hot holes generated by the junction capacitance in addition to the hot holes generated by the well capacitance increases the amount of the hot holes injected into the floating gate and therefore further increases the erasure speed. As can be seen in FIG. 11, a leakage current through the control gate 5 can be generated even at a small junction potential condition. The line S1 illustrates the drain current, with the N-well and the junction region being floated while the line S2 illustrates the drain current, with only the junction region being floated. The line S3 illustrates the leakage current through the control gate, with the N-well and the junction region being floated, while the line S4 illustrates the leakage current through the control gate, with only the junction region being floated.

A parasitic junction capacitor is generated during the erasure process, so that hot holes are generated without additional flow of current being generated. The generated hot holes are injected in to the floating gate 3, thereby increasing the erasure speed of the flash memory cell Therefore, as the erasure speed of the flash memory cell is increased, the thickness of the tunnel oxide film 2 can be increased. The electromagnetic field itself formed by the charges trapped in the tunnel oxide film 2, reduce the loss of data. Also, immunity against physical damage generated by the trapped charges in the tunnel oxide film 2 can be increased and the breakdown of the tunnel oxide film 2 generated by the programming and the erasure operation can be prevented.

Also, as the thickness of the dielectric film 4 is increased, the capacitance between the floating gate 3 and the control gate 5 can be reduced and the loss of data associated with differences in the concentrations of the charged electrons can be prevented thereby improving the data conservation capability of a flash memory cell device.

Although the teachings of the present invention have been illustrated with reference to particular examples, those having ordinary skill in the art will appreciate that the scope of this patent is not limited to those examples. On the contrary, this patent is intended to cover any and all methods falling within the scope of the appended claims.

What is claimed is:

1. A method of erasing a flash memory cell including: the steps of:

floating an N-well, a source, and the a drain;

applying a negative voltage to a control gate;

applying a positive voltage to a P-well;

applying a ground voltage to the P-well;

applying a ground voltage to the control gate;

applying a ground voltage at the source and the drain; and applying a ground voltage to the N-well.

2. The method of erasing the flash memory cell according to claim 1, wherein the dopant concentration of the N-well is within a range of $1E1/cm^3$ to $1E19/cm^3$ and the dopant concentration of the P-well falls within a range of $1E16/cm^3$ to $1E18/cm^3$.

3. The method of erasing the flash memory cell according to claim 1, wherein the positive voltage applied to the P-well within a range of 5V to 12V.

4. The method of erasing the flash memory cell according to claim 1, wherein the flash memory cell comprises a tunnel oxide film, a floating gate, a dielectric film, and a control gate.

5. The method of erasing the flash memory cell according to claim 4, wherein the thickness of the tunnel oxide film is within a range of 100 Å to 200 Å.

6. The method of erasing the flash memory cell according to claim 1, wherein a ground voltage of 0V is applied to the N-well, the P-well, the source, the drain, and the control gate.

7. The method of erasing the flash memory cell according to claim 1, further includes a verification for the erase step after erasing the flash memory cell.

8. The method of erasing the flash memory cell according to claim 1, wherein the flash memory cell uses F-N tunneling in combination with a hot hole electrons.

* * * * *